(12) United States Patent
Matsuno et al.

(10) Patent No.: US 8,377,811 B2
(45) Date of Patent: Feb. 19, 2013

(54) METHOD FOR MANUFACTURING SILICON CARBIDE SEMICONDUCTOR DEVICE

(75) Inventors: Yoshinori Matsuno, Tokyo (JP); Kenichi Ohtsuka, Tokyo (JP); Kenichi Kuroda, Tokyo (JP); Shozo Shikama, Tokyo (JP); Naoki Yutani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/188,676

(22) Filed: Aug. 8, 2008

(65) Prior Publication Data

US 2009/0098719 A1 Apr. 16, 2009

(30) Foreign Application Priority Data

Oct. 11, 2007 (JP) .................................. 2007-265393

(51) Int. Cl.
   *H01L 21/28* (2006.01)

(52) U.S. Cl. .. 438/570; 438/571; 438/582; 257/E21.064

(58) Field of Classification Search ........... 438/570–583
   See application file for complete search history.

(56) References Cited

U.S. PATENT DOCUMENTS

| | | | | |
|---|---|---|---|---|
| 4,742,377 A | * | 5/1988 | Einthoven | 257/484 |
| 5,789,311 A | * | 8/1998 | Ueno et al. | 438/573 |
| 2003/0183895 A1 | * | 10/2003 | Okamura et al. | 257/454 |
| 2004/0018744 A1 | * | 1/2004 | Okajima et al. | 438/745 |
| 2006/0183267 A1 | * | 8/2006 | Roccaforte et al. | 438/92 |
| 2008/0237608 A1 | * | 10/2008 | Richieri | 257/77 |

FOREIGN PATENT DOCUMENTS

| | | |
|---|---|---|
| EP | 1739753 A1 | 1/2007 |
| JP | 59-103375 | 6/1984 |
| JP | 1-295427 | 11/1989 |
| JP | 8-23083 | 1/1996 |
| JP | 2000-49363 | 2/2000 |
| JP | 2000-164528 | 6/2000 |
| JP | 2000-236099 | 8/2000 |
| JP | 2000-277739 | 10/2000 |

(Continued)

OTHER PUBLICATIONS

Office Action issued Oct. 19, 2010 in Japanese Application No. 2007-265393 (With Partial English Translation).

(Continued)

*Primary Examiner* — Thanh Nguyen
(74) *Attorney, Agent, or Firm* — Oblon, Spivak, McClelland, Maier & Neustadt, L.L.P.

(57) ABSTRACT

An object of the invention is to provide a method for manufacturing a silicon carbide semiconductor device having constant characteristics with reduced variations in forward characteristics. The method for manufacturing the silicon carbide semiconductor device according to the invention includes the steps of: (a) preparing a silicon carbide substrate; (b) forming an epitaxial layer on a first main surface of the silicon carbide substrate; (c) forming a protective film on the epitaxial layer; (d) forming a first metal layer on a second main surface of the silicon carbide substrate; (e) applying heat treatment to the silicon carbide substrate at a predetermined temperature to form an ohmic junction between the first metal layer and the second main surface of the silicon carbide substrate; (f) removing the protective film; (g) forming a second metal layer on the epitaxial layer; and (h) applying heat treatment to the silicon carbide substrate at a temperature from 400° C. to 600° C. to form a Schottky junction of desired characteristics between the second metal layer and the epitaxial layer.

15 Claims, 2 Drawing Sheets

FOREIGN PATENT DOCUMENTS

| | | |
|---|---|---|
| JP | 2002-261295 | 9/2002 |
| JP | 2003-60193 | 2/2003 |
| JP | 2004-172400 | 6/2004 |
| JP | 2004-266115 | 9/2004 |
| JP | 2004-363326 | 12/2004 |
| JP | 2005-286197 | 10/2005 |
| JP | 2006-120761 | 5/2006 |
| JP | 2006-237394 | 9/2006 |
| JP | 2006-313850 | 11/2006 |
| JP | 3884070 | 11/2006 |
| JP | 3890311 | 12/2006 |
| JP | 2007-115875 | 5/2007 |
| JP | 2007-235162 | 9/2007 |

OTHER PUBLICATIONS

Office Action issued Jun. 14, 2011, in Japanese Patent Application No. 2009-292384 (with partial English-language translation).

D. Defives, et al., "Electrical characterization of inhomogeneous Ti/4H-SiC Schottky contacts", Materials Science and Engineering, B61-62, 1999, pp. 395-401.

Office Action issued Nov. 15, 2011 in German Patent Appl. No. 10-2008-047159.3, filed Sep. 15, 2008 (with an English translation).

Notification of Offer Form issued Mar. 13, 2012 in Japanese Application No. 2009-292384 (With English Translation).

D. Alok, et al., "Effect of Surface Preparation and Thermal Anneal on Electrical Characteristics of 4H-SiC Schottky Barrier Diodes", Materials Science Forum, vols. 264-268, 1998, pp. 929-932.

Gunter Petzow, "Mertallographisches Ätzen", Metal Etching Technology, 1977, pp. 94-97.

Japanese Office Action for Japanese Application No. 2009-292384, dated Sep. 27, 2012.

D. Defives, et al, Electrical characterization of in homogeneous Ti/4H-SiC Schottky contacts, Materials Science and Engineering B, 1999, vol. 61-62, p. 395-401.

\* cited by examiner

METHOD FOR MANUFACTURING SILICON CARBIDE SEMICONDUCTOR DEVICE

BACKGROUND OF THE INVENTION

1. Field of the Invention

The present invention relates to a method for manufacturing a silicon carbide semiconductor device, and more particularly relates to a method for manufacturing a silicon carbide Schottky barrier diode.

2. Description of the Background Art

In manufacture of a silicon carbide Schottky barrier diode (hereinafter, described as SiC-SBD), what are important are selection of a Schottky metal material and stabilization of forward characteristics thereof. Common examples of the Schottky metal material include Ti, Ni, Mo, W, and the like. In a case of manufacturing a Ti Schottky diode provided on a rear surface thereof with an Ni ohmic junction, there arise the following process features and problems.

In a kV class high withstand voltage SiC Schottky diode, a p-type termination structure is essentially required for relaxation of a peak of an electric field (electric field concentration), since electric field concentration is normally caused in the vicinity of an outer edge of a Schottky electrode. In general, such a termination structure is formed by implanting ions of p-type impurities such as Al (aluminium) and B (boron) into an n-type epitaxial layer and performing activation annealing at a high temperature of at least around 1500° C.

In order to form a Ti Schottky junction of excellent characteristics, the Schottky junction is desirably formed on a front surface in an early stage of a wafer process. However, the Ni ohmic junction to be formed on the rear surface should be formed by annealing at a high temperature of approximately 1000° C., while the Ti Schottky junction is not strong enough to be kept in an appropriate state at such a high temperature. Therefore, it is presently general to form the Ni ohmic junction on the rear surface and then form the Ti Schottky junction on the front surface.

Japanese Patent Laid-Open No. 3890311 discloses a method for manufacturing a semiconductor device by forming at one time a Schottky junction on a front surface and an ohmic junction on a rear surface. Techniques relevant to the present invention are also disclosed in Japanese Patent Laid-Open No. 3884070, Japanese Patent Application Laid-Open No. 2004-172400, and Japanese Patent Application Laid-Open No. 2000-164528.

In manufacture and evaluation of an SiC-SBD, characteristics of a backward leakage current and a backward withstand voltage out of device characteristics thereof are greatly influenced by a defect in a wafer or a epitaxial layer as well as a defect in process. Forward characteristics, particularly barrier heights $\phi B$ and an n-value, are greatly influenced by preprocessing conditions in forming a Schottky junction, conditions in forming a Schottky metal film, a method for patterning the Schottky metal, and conditions in burning and heating after application of a sealant such as polyimide. The Ti Schottky diode has also been required to be manufactured such that the above-described processes do not influence the forward characteristics. However, an SiC-SBD manufactured in accordance with a conventional method has a problem that forward characteristics thereof are not stabilized, and in particular, barrier heights $\phi B$ are varied in a range of approximately 1.05 to 1.25 eV.

The manufacturing method described in Japanese Patent Laid-Open No. 3890311 would be ideal if metals of a same type are used as a Schottky material for a front surface and an ohmic material for a rear surface and excellent junctions are obtained by annealing at one time. However, this method remarkably narrows process margins in practice, and therefore, is not suitable for a mass production process in view of objects such as increasing a rate of excellent qualities in an entire wafer and manufacturing devices stably and reproducibly.

SUMMARY OF THE INVENTION

An object of the present invention is to provide a method for manufacturing a silicon carbide semiconductor device having constant characteristics with less variations in forward characteristics.

According to the present invention, the method for manufacturing a silicon carbide semiconductor device includes the following steps (a) to (h).

The step (a) is to prepare a silicon carbide substrate.

The step (b) is to form an epitaxial layer on a first main surface of the silicon carbide substrate.

The step (c) is to form a protective film on the epitaxial layer.

The step (d) is to form a first metal layer on a second main surface of the silicon carbide substrate.

The step (e) is to apply, after the step (d), heat treatment to the silicon carbide substrate at a predetermined temperature so as to form an ohmic junction between the first metal layer and the second main surface of the silicon carbide substrate.

The step (f) is to remove, after the step (e), the protective film.

The step (g) is to form, after the step (f), a second metal layer on the epitaxial layer.

The step (h) is to apply, after the step (g), heat treatment to the silicon carbide substrate at a temperature from 400° C. to 600° C. so as to form a Schottky junction of desired characteristics between the second metal layer and the epitaxial layer.

It is possible to reduce the variations in the forward characteristics, and in particular, a variation in barrier heights $\phi B$ by keeping the silicon carbide substrate covered with the protective film until a Schottky metal is formed and by applying heat sintering to anneal at a temperature from 400° C. to 600° C. after a Schottky metal film is formed. Accordingly, it is possible to manufacture and provide a device chip having constant forward characteristics.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1A:
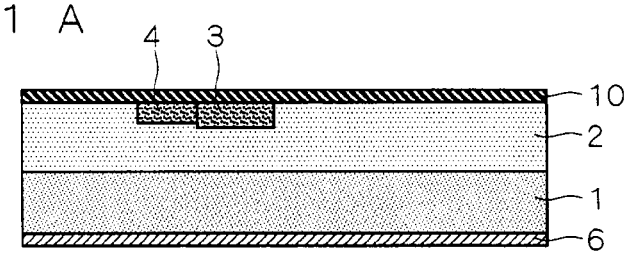
FIGS. 1A, 1B, 1C, and 1D are cross sectional views showing a process of manufacturing a silicon carbide semiconductor device according to First Embodiment of the present invention.
Figure 1A:
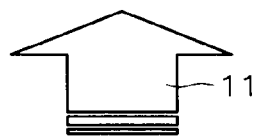
Figure 1B:
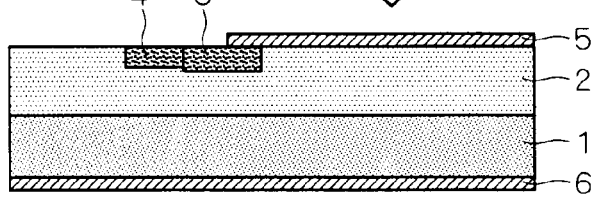
Figure 1B:
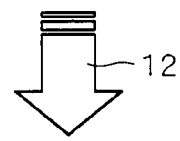

FIGS. 1A to 1D are cross sectional views showing a process of manufacturing a silicon carbide semiconductor device (silicon carbide Schottky diode; hereinafter, described as SiC-SBD) according to First Embodiment of the present invention. The manufacturing process includes the following first to fourth steps.

First Step: To begin with, description is given to the process until an ohmic junction is formed with reference to FIG. 1A. There is prepared an n-type silicon carbide substrate. The present embodiment is described in a case of using an $n^+$ substrate 1 provided with a 4H—SiC (0001) silicon surface. The $n^+$ substrate 1 has a resistivity of approximately 0.02Ω·cm.

Subsequently, there is formed on a front surface of the $n^+$ substrate 1 an n-type epitaxial layer 2 including impurities at a concentration of as low as approximately $5 \times 10^{15}/cm^3$. A front surface of the n-type epitaxial layer 2 is sacrificially oxidized to form a protective film such as an $SiO_2$ thermally oxidized film 10 on a reverse side of the $n^+$ substrate 1. The thermally oxidized film 10 formed on the front surface of the n-type epitaxial layer 2 functions as a process protective film. As described later, the thermally oxidized film 10 is removed immediately before a metal layer 5 (see FIG. 1B) is formed, so that the front surface of the n-type epitaxial layer 2 is reproducibly stabilized also from a chemical point of view after the thermally oxidized film 10 is removed, thereby enabling formation of an excellent Schottky junction. It is noted that the thermally oxidized film 10 is an $SiO_2$ thermally oxidized film having a thickness from 10 nm to 50 nm.

Formed next is a termination structure in the n-type epitaxial layer 2. Since electric field concentration tends to occur at an end of a Schottky electrode, the termination structure is formed to relax the electric field concentration and stably secure an over kV class withstand voltage. In order to obtain such a termination structure, Al ions are implanted to form a GR (Guard Ring) implantation layer 3 functioning as a structure for relaxing the electric field concentration at the end of the Schottky electrode. Further, implanted to an immediate outside of the GR implantation layer 3 are Al ions having a concentration slightly lower than that of the GR implantation layer 3, so as to form a JTE (Junction Termination Extension) implantation layer 4 for reducing a surface electric field.

Then, annealing (heat treatment) is performed to activate the Al ions included in both of the GR implantation layer 3 and the JTE implantation layer 4. Such annealing can be conducted by using an SiC-CVD device of a Furness type in an atmosphere of depressurized $H_2$ and $C_3H_8$ at 1350° C. for approximately 15 minutes. By conducting such annealing, $C_3H_8$ suppresses sublimation of carbon atoms from silicon carbide thereby to suppress, to less than 1 nm, height differences in surface irregularity such as bunching steps generated after the annealing is performed. As the height differences in the surface irregularity are suppressed to less than 1 nm, oxidized portions can be avoided to remain after the $SiO_2$ thermally oxidized film is removed.

This annealing may be performed by using an annealing furnace of an RTA type in an atmosphere of Ar under an ordinary pressure, instead of by using highly vacuumed gas or a particular kind of gas such as $H_2$, $C_3H_8$, or the like.

In a case where annealing is performed by using the annealing furnace of the RTA type in the atmosphere of Ar under the ordinary pressure, an effective technique for suppressing generation of bunching steps is mounting a graphite cap (G-cap) to perform the annealing. When annealing is applied to a wafer structure provided with a graphite cap by using a single wafer furnace of an RTA type at a temperature ranging from at least 1500° C. to 1700° C. for 10 minutes, a p-type implantation layer sufficiently functions as a termination structure with an activation rate of at least 50% and there is generated no bunching step having a height of 1 nm or more.

On the other hand, in a case where no G-cap is provided, there are generated bunching steps having heights of approximately 20 nm and a leakage current is increased due to such an irregular shape. On an SiC surface provided with the bunching steps having heights of approximately 20 nm, there appears another surface orientation in addition to the (0001) silicon surface. As apparent from the fact that a thermally oxidized (000-1) carbon surface is formed with an $SiO_2$ thermally oxidized film 10 having a thickness of at least about 10 times of that of the (0001) silicon surface, the variation is remarkably increased in the thickness of the $SiO_2$ thermally oxidized film 10 in the wafer surface, so that the thermally oxidized film 10 may improperly remain locally even after fluorine etching is performed to remove the oxidized film and that the leakage current is increased.

In the SiC-SBD, Ti is adopted as a material for the Schottky junction on the (0001) silicon surface on the front side, and Ni is adopted as a material for the ohmic junction on the (000-1) carbon surface on the rear side. One of the major reasons why the (0001) silicon surface is formed with the Schottky junction is that, in a case of epitaxially growing an n-type drift layer of excellent quality on an n-type 4H—SiC substrate, it is generally understood to be technically difficult to obtain epitaxial growth of excellent quality on the (000-1) carbon surface. In addition, as the sacrificially oxidized film can be limited to be relatively thin on the (0001) silicon surface, it is possible, as a result, to prevent the oxidized film from being remained.

In the SiC-SBD, an interface between Ti and SiC includes the junction that most influences the device characteristics. Accordingly, it is desirable to form a Ti metal layer 5 to be provided with a Schottky junction on the front surface and then to form an Ni metal layer 6 to be provided with an ohmic junction on the rear surface. However, formation of an excellent Ni ohmic junction requires annealing at approximately 1000° C., while a Ti Schottky junction is destroyed in such a process at a high temperature. Therefore, in the present embodiment, firstly formed is the Ni ohmic junction on the rear surface and secondly formed is the Ti Schottky junction on the front surface.

Figure 2:
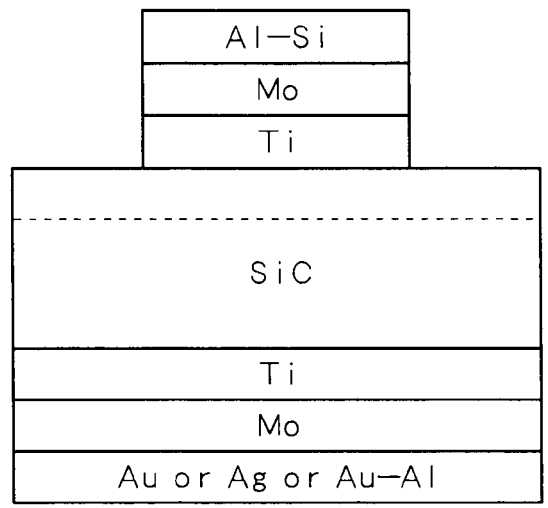
FIG. 2 is a cross sectional view showing a conventional silicon carbide semiconductor device.

It is ideal, as in the invention described in Japanese Patent Laid-Open No. 3890311 and illustrated in FIG. 2, to anneal and burn to obtain excellent junctions at one time by using metals of a same type as a Schottky material for a front surface and an ohmic material for a rear surface. However, this technique extremely narrows process margins and is not preferable as a device cannot be manufactured stably and reproducibly.

Described below is a process of forming the ohmic junction on the rear surface (surface on the opposite side of the n-type epitaxial layer 2) of the substrate 1. The Ni metal layer 6 functioning as a first metal layer is evaporated onto the rear surface of the SiC substrate 1, and then heat treatment (annealing) is performed to form the ohmic junction. At this stage, a planarized state and the like of the SiC carbon surface on the rear side, formation of the Ni metal layer 6 for the ohmic junction, and conditions in ohmic annealing are set such that Ni silicide is appropriately formed at an interface between SiC and Ni to prevent redundant carbons from adversely affecting to cause segregation and the like.

When annealing is performed at approximately 1000° C. after an Ni film having a thickness of 100 nm is formed in order to form the Ni ohmic junction on the rear surface, the front surface, which is required to be kept clean, is formed with the sacrificially oxidized film 10 functioning as the process protective film. While annealing with Ni is applied to the rear surface, the sacrificially oxidized film 10 prevents the front surface of the n-type epitaxial layer 2 of an SiC wafer, which is to be formed with a Ti Schottky junction, from being exposed to Ni on the rear surface of the wafer or metal impurities generated from an annealing device.

As described above, in a case where the Ni ohmic junction is formed on the rear surface before the Ti Schottky junction is formed on the front surface, protection by the thermally oxidized film 10 of the surface to be formed with the Ti Schottky junction can realize reduction of variations in characteristics by Ti sintering 12 to be described later.

Second Step: Then, with reference to FIG. 1B, description is given to the process until the Schottky junction is formed on the front surface. The n-type drift layer (n-type epitaxial layer 2) is epitaxially grown on the (0001) silicon surface of the n-type 4H—SiC substrate 1. Provided on the n-type epitaxial layer 2 is the metal layer 5 by evaporating a Ti film functioning as a second metal layer. Patterning is performed onto the metal layer 5, and then heat treatment (Ti sintering 12) is applied at a temperature from 400° C. to 600° C., so that a Schottky junction of desired characteristics is formed. Use of Ti as the material for the Schottky junction allows desired forward characteristics and simplifies fabrication processes such as wet etching to be described later.

Formation of a Ti Schottky junction of stable characteristics requires cautious control on a state of an interface thereof. Specifically, in order to form a termination structure of the GR implantation layer 3 and the JTE implantation layer 4, it is important to control heat treatment in the annealing process to activate Al ions implanted to the n-type epitaxial layer 2 as well as to control the further following heat treatments.

In a Ti/n-type SiC Schottky junction, application of the Ti sintering 12 increases barrier heights φB to about 1.25 eV and also reduces the variation thereof. The Ti sintering 12 is preferably performed after patterning is applied to the metal layer 5, since the Ti sintering 12 forms, at the interface between Ti and n-type SiC, a transition layer such as a silicide layer, which affects patterning of the Ti metal layer 5 by wet etching or the like. The Ti sintering 12 is performed by keeping the highest temperature from 10 seconds to 30 minutes with a rate of temperature increase from 5° C./second to 25° C./second. Such conditions in the Ti sintering 12 prevent damages to the wafer due to rapid thermal distortion, and also enable appropriate heating in a short period of time.

Figure 1C:
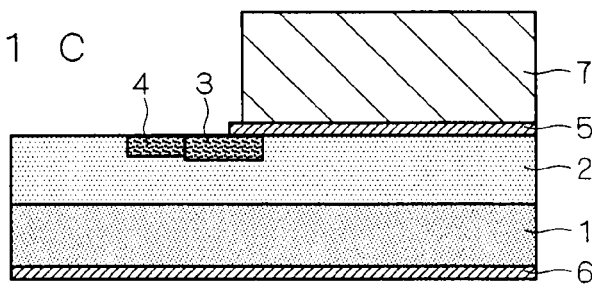
Figure 1D:
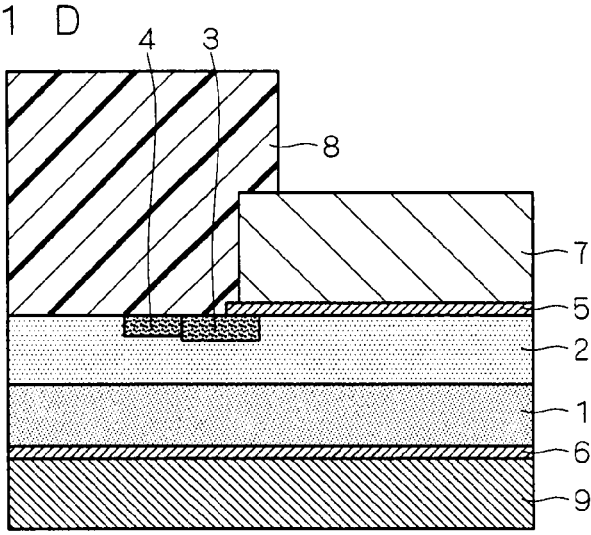

Third Step: With reference to FIG. 1C, description is given to the process until a front surface electrode 7 is formed on the metal layer 5. After the patterning and the Ti sintering 12 are applied to the metal layer 5, evaporated thereonto is Al or the like having a thickness of 3 μm. In a photoengraving process, patterning is applied to a resist opening by wet etching with use of heated phosphoric acid or the like.

The Ti sintering 12 is more preferably applied after the Ti metal layer 5 is formed thereon with an Al electrode pad (front surface electrode 7) having a thickness of approximately 3 μm. Application of the patterning and the Ti sintering 12 after the electrode pad is formed is effective to increase adhesiveness at an interface between Al and Ti. Furthermore, patterning by wet etching can be applied at the same time to the Schottky metal (Ti metal layer 5) and the electrode pad (front surface electrode 7), resulting in decrease by one time the number of photoengraving processes.

Fourth Step: Lastly, with reference to FIG. 1D, description is given to the process until polyimide 8 and a rear surface electrode 9 are formed. After metallizing the front surface with Al, a surface sealant such as the polyimide 8 is applied and burned on the n-type epitaxial layer 2 and the front surface electrode 7. The temperature for curing (burning) is set to be lower by at least 50° C. than the temperature for heating in the Ti sintering 12 for formation of the Schottky junction, so as not to unstablize again the state of the interface of the Schottky junction which is once stabilized by the Ti sintering 12.

Then, after the polyimide is cured, the rear surface electrode 9 is formed on the rear surface of the $n^+$ substrate 1 at the last stage of the wafer process. Metallizing with Ni and Au can improve solder wettability for a case where a chip is die bonded on a rear surface thereof. It is noted that the rear surface electrode 9 is formed after the polyimide is cured. If the polyimide 8 were formed and cured lastly after the rear surface is metallized with Ni and Au, Ni included in a lower layer would be diffused in an Au surface to form Ni oxide in the step of curing the polyimide at 350° C., thereby arising a problem of extreme deterioration in solder wettability.

Figure 3:
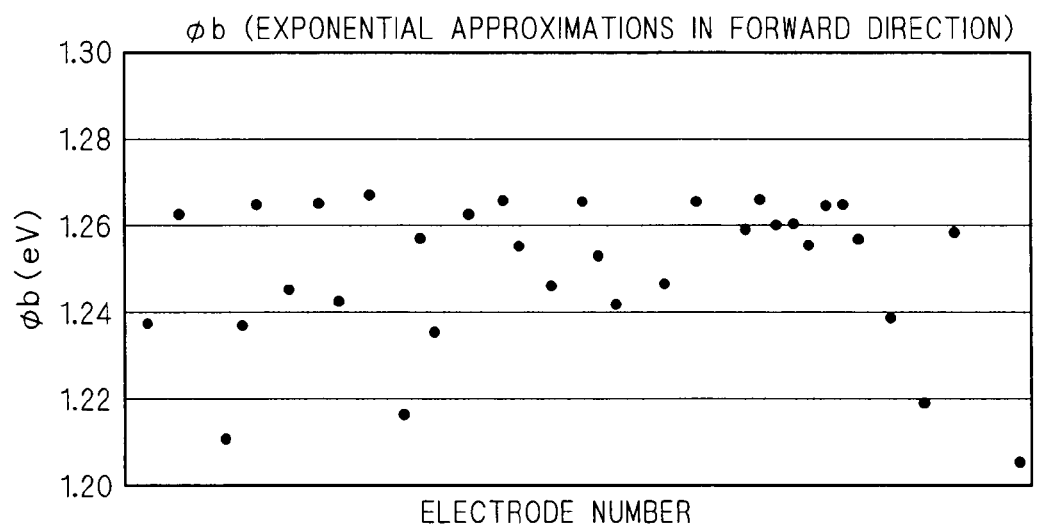
FIG. 3 is a graph showing characteristics of barrier heights $\phi B$ of the silicon carbide semiconductor device according to First Embodiment of the present invention.

FIG. 3 is a graph showing measurements of characteristics of the barrier heights φB in the SiC-SBD which is manufactured in accordance with the above-described method. As shown in FIG. 3, the barrier heights φB range from approximately 1.24 to 1.27 eV. In comparison with the barrier heights φB in a conventional SiC-SBD ranging from 1.05 to 1.25 eV, it is found that the variation is reduced in the present embodiment.

As described above, in the method for manufacturing the SiC-SBD according to the present embodiment, the silicon carbide substrate is covered with the protective film until the Schottky metal is formed, and the substrate is heated and annealed by applying the Ti sintering 12 at a temperature from 400° C. to 600° C. after the Schottky metal film is formed. As a result, the variations can be reduced in the forward characteristics, and in particular, the variation in the barrier heights φB. Therefore, it is possible to manufacture and provide a device chip having constant forward characteristics.

Second Embodiment

A method for manufacturing an SiC-SBD according to the present embodiment is characterized in that sacrificial oxidation is performed for a plurality of times. Below described is the method for manufacturing the SiC-SBD according to the present embodiment. A thermally oxidized film 10 which is formed to protect a front surface of an n-type epitaxial layer 2 is removed after Al ions are implanted to form a termination structure and before activation annealing is performed. Since the thermally oxidized film 10 is irregularly disappears at a temperature for activation annealing of at least 1400° C., the thermally oxidized film 10 is entirely removed preliminarily, so as to prevent adverse remaining thereof. Also in view of avoiding and suppressing generation of surface irregularity such as bunching steps as referred to in First Embodiment, removing the entire $SiO_2$ thermally oxidized film 10 is effective to reduce variations in forward characteristics of a device chip under a condition of a temperature exceeding a limit of resistance to heat for the $SiO_2$ thermally oxidized film 10.

The uppermost front surface of the n-type epitaxial layer 2 after being applied with activation annealing for formation of the termination structure is generally regarded to be unstable with a lot of carbons included therein. Therefore, the uppermost front surface thereof may be removed by approximately 0.1 μm by performing dry etching such as RIE. Thereafter, another sacrificial oxidation is performed to form again a thermally oxidized film 10, also for a purpose of further performing dry etching to remove surface damages. Performing sacrificial oxidation twice is also effective to reduce defects in the process.

As described above, sacrificial oxidation performed at least twice in accordance with detailed situations in the process is effective for reduction of defects in the process due to particles or for inactivation of crystal defects.

Third Embodiment

In First Embodiment, description is given to a case where Ti is used as the Schottky electrode. However, it is possible to use metal other than Ti, such as Ni, Mo, and W. Differences in work functions and in effects of binding with SiC according to metal materials definitely differ barrier heights φB in a forward direction which are obtained as diode characteristics.

Fourth Embodiment

In First Embodiment, description is given to a case where the SiO$_2$ thermally oxidized film 10 is used as the protective film. However, it is possible to use, in place of the SiO$_2$ thermally oxidized film 10, a CVD oxide film, an SiN nitride film, an SiON oxynitride film, or the like.

While the invention has been shown and described in detail, the foregoing description is in all aspects illustrative and not restrictive. It is therefore understood that numerous modifications and variations can be devised without departing from the scope of the invention.

What is claimed is:

1. A method for manufacturing a silicon carbide semiconductor device, comprising:
   (a) preparing a silicon carbide substrate;
   (b) forming an epitaxial layer on a first main surface of said silicon carbide substrate;
   (c) forming a protective film on said epitaxial layer;
   (d) forming a first metal layer on a second main surface of said silicon carbide substrate;
   (e) applying, after said step (d), heat treatment to said silicon carbide substrate at a predetermined temperature to form an ohmic junction between said first metal layer and the second main surface of said silicon carbide substrate;
   (f) removing, after said step (e), said protective film from a surface of said epitaxial layer;
   (g) forming, after said step (f), a Ti layer on said epitaxial layer;
   (i) applying, after said step (g), patterning to said Ti layer by etching;
   (h) applying, after said step (i), heat treatment to said silicon carbide substrate at temperature from 400° C. to 600° C. to form a Schottky junction of desired characteristics between said Ti layer and said epitaxial layer,
   (m) wherein said protective film prevents a surface of said epitaxial layer from being exposed to impurities generated during said heat treatment of said step (e) and is entirely removed from said surface of said epitaxial layer before forming said Ti layer in said step (g).

2. The method for manufacturing the silicon carbide semiconductor device according to claim 1, wherein, in said step (c), an SiO$_2$ film functioning as said protective film is formed on said epitaxial layer.

3. The method for manufacturing the silicon carbide semiconductor device according to claim 1, wherein, in said step (c), an SiO$_2$ thermally oxidized film having a thickness from 10 nm to 50 nm and functioning as said protective film is formed on said epitaxial layer.

4. The method for manufacturing the silicon carbide semiconductor device according to claim 1, wherein, in said step (h), as one of conditions in the heat treatment, the temperature is kept at the maximum for 10 seconds to 30 minutes.

5. The method for manufacturing the silicon carbide semiconductor device according to claim 4, further comprising:
   between said step (g) and said step (i), (k) forming an electrode pad metal layer on said Ti layer, wherein
   in said step (i), patterning is applied at the same time to said Ti layer and said electrode pad metal layer.

6. The method for manufacturing the silicon carbide semiconductor device according to claim 4, wherein, in said step (b), the epitaxial layer is formed on a (0001) silicon surface which is the first main surface of said silicon carbide substrate.

7. The method for manufacturing the silicon carbide semiconductor device according to claim 4, further comprising:
   (l) forming implanting ions into said epitaxial layer to form a termination structure to relax an electric field concentration at the end of a Schottky electrode.

8. The method for manufacturing the silicon carbide semiconductor device according to claim 4, wherein, in said step (c), an SiO$_2$ film functioning as said protective film is formed on said epitaxial layer.

9. The method for manufacturing the silicon carbide semiconductor device according to claim 4, wherein, in said step (c), an SiO$_2$ thermally oxidized film having a thickness from 10 nm to 50 nm and functioning as said protective film is formed on said epitaxial layer.

10. The method for manufacturing the silicon carbide semiconductor device according to claim 1, wherein, in said step (h), as an additional condition in the heat treatment, the temperature is increased at a rate from 5° C./second to 25° C./second.

11. The method for manufacturing the silicon carbide semiconductor device according to claim 1, further comprising:
    between said step (g) and said step (i), (k) forming an electrode pad metal layer on said Ti layer, wherein
    in said step (i), patterning is applied at the same time to said Ti layer and said electrode pad metal layer.

12. The method for manufacturing the silicon carbide semiconductor device according to claim 1, wherein, in said step (b), the epitaxial layer is formed on a (0001) silicon surface which is the first main surface of said silicon carbide substrate.

13. The method for manufacturing the silicon carbide semiconductor device according to claim 1, further comprising:
    (l) forming implanting ions into said epitaxial layer to form a termination structure to relax an electric field concentration at the end of a Schottky electrode.

14. The method for manufacturing the silicon carbide semiconductor device according to claim 1, further comprising:
    (j) applying a surface sealant onto said epitaxial layer and onto said Ti layer, and applying heat treatment to the surface sealant at a temperature lowered by at least 50° C. than the temperature of the heat treatment to form a Schottky junction between said Ti layer and said epitaxial layer in said step (h).

15. The method of manufacturing the silicon carbide semiconductor device according to claim 1, wherein said step (f) is performed by fluorine etching.

* * * * *